United States Patent
Futatsugi

[19]

[11] Patent Number: 5,889,288
[45] Date of Patent: Mar. 30, 1999

[54] SEMICONDUCTOR QUANTUM DOT DEVICE

[75] Inventor: Toshiro Futatsugi, Kawasaki, Japan

[73] Assignee: Fujitsu Limited, Kanagawa, Japan

[21] Appl. No.: 684,917

[22] Filed: Jul. 22, 1996

Related U.S. Application Data

[63] Continuation of Ser. No. 302,975, Sep. 12, 1994, abandoned.

[30]    Foreign Application Priority Data

Sep. 14, 1993  [JP]  Japan .................................. 5-229077

[51] Int. Cl.⁶ ........................ H01L 29/15; H01L 29/772
[52] U.S. Cl. ..................... 257/20; 257/187; 257/17; 257/24; 257/195
[58] Field of Search ................................ 257/17, 20, 27, 257/24

[56]    References Cited

U.S. PATENT DOCUMENTS 4,581,621  4/1986  Reed ........................................ 257/25
5,291,034  3/1994  Allam et al. ............................. 257/17

*Primary Examiner*—Jerome Jackson, Jr.
*Attorney, Agent, or Firm*—Armstrong, Westerman, Hattori, McLeland & Naughton

[57]    ABSTRACT

A semiconductor quantum dot device using a semiconductor quantum dot comprises a semiconductor quantum dot formed on a semiconductor wafer, a field effect transistor formed on said semiconductor wafer and comprising a gate electrode formed in a vicinity of said semiconductor quantum dot, and a coupling means to couple said gate electrode and said semiconductor quantum dot capacitively.

10 Claims, 4 Drawing Sheets

SEMICONDUCTOR QUANTUM DOT DEVICE

This application is a continuation of application Ser. No. 08/302,975 filed Sep. 12, 1994, now abandoned.

BACKGROUND OF THE INVENTION a) Field of the Invention

The present invention relates to a micro dimension electronic device, and more particularly to a micro dimension electronic device using semiconductor quantum dot. Here, the term "micro" means "very small" and usually expresses a dimension less than the order of micron.

b) Description of the Related Art

In recent years, associated with a progress of techniques on fine processing, micro dimension electronic devices including portions of such dimensions as generating quantum effects are starting to be manufactured.

Elements having such structures that confine carriers of charge in a one-dimensional direction as quantum well, in two-dimensional directions as quantum wire, in three-dimensional directions as quantum dot, or the like, have been manufactured. For such elements, not a small number of new phenomena which have been impossible to be attained in conventional devices are being found. Researches to work out new devices or systems using such phenomena are being focused.

Such a quantum effect device, having a micro dimension, generates an output signal which is also very small. Consequently, a serious problem arise how to take out signal from the inside of the device to an external circuit.

Electron devices using quantum dot can be considered to have a function of carrying out a logical operation or of storing a memory by utilizing an in/out behavior of a single electron to the quantum dot. Even when such function can be performed, it is, however, difficult to practically utilize the phenomenon unless detection of the state, for example, detecting a change in the number of electrons within a quantum dot, is made possible.

A method that detects a change of electric potential in a quantum dot by electrically connecting a gate electrode of an insulated gate type field effect transistor to the quantum dot could be considered. In connecting the gate electrode of a field effect transistor of the actual size to the quantum dot, however, parasitic capacitance of the quantum dot becomes so large, that a change in electric potential when a single electron moves into and out of the quantum dot becomes so small to be detected under thermal noise even at a considerable low temperature.

When a plurality of electrodes are disposed in the vicinity of a quantum well layer and depletion layers are developed into the quantum well by application of reverse bias voltage to the electrodes, a plurality of quantum dots can be formed within a quantum well layer. By connecting an electrode associated with a quantum dot with another electrode associated with another quantum dot, the voltage of a quantum dot can be transferred to another quantum dot. In this case, when there is a current flow in the other quantum dot, a change in voltage can be converted to a change in current.

However, considering this kind of signal transfer as the change in voltage, only a change in voltage of at most the order of mV is converted to a change in voltage at most of the order of mV. Thus, no solution is given to the problem of how to take out an output signal to the external circuit.

Thus, in an electronic device using quantum dot, it has been difficult to take out a state of quantum dot to an external circuit as an electric signal. It has been particularly difficult to detect the change in number of electron within a quantum dot.

SUMMARY OF THE INVENTION

An object of the present invention is to provide a semiconductor quantum dot device which enables an expedient detection of the state of a semiconductor quantum dot.

Another object of the present invention is to provide a semiconductor quantum dot device which enables a simple detection of the change in the number of electrons within a semiconductor quantum dot.

According to one aspect of the present invention, there is provided a semiconductor quantum dot device comprising a semiconductor quantum dot formed in a semiconductor wafer, a field effect type transistor formed in the semiconductor wafer and comprising a gate electrode formed in the vicinity of the semiconductor quantum dot, and coupling means for coupling the gate electrode and the semiconductor quantum dot capacitively.

Since the semiconductor quantum dot and the gate electrode of the field effect transistor are coupled capacitively with a small capacitance, the semiconductor quantum dot can be kept in an isolated state, and the state is conveyed to the gate electrode with a sufficient intensity.

For example, when a single electron comes in and goes out of the semiconductor quantum dot, by maintaining a potential change large enough than thermal noise, a change of state of the semiconductor quantum dot can be securely transmitted to the gate electrode of the field effect transistor.

By amplifying input signal with the field effect transistor, an amplified signal is taken out to an external circuit. Thus a change of state of the semiconductor quantum dot is easily taken out.

DESCRIPTION OF THE PREFERRED EMBODIMENTS

Figure 1A:
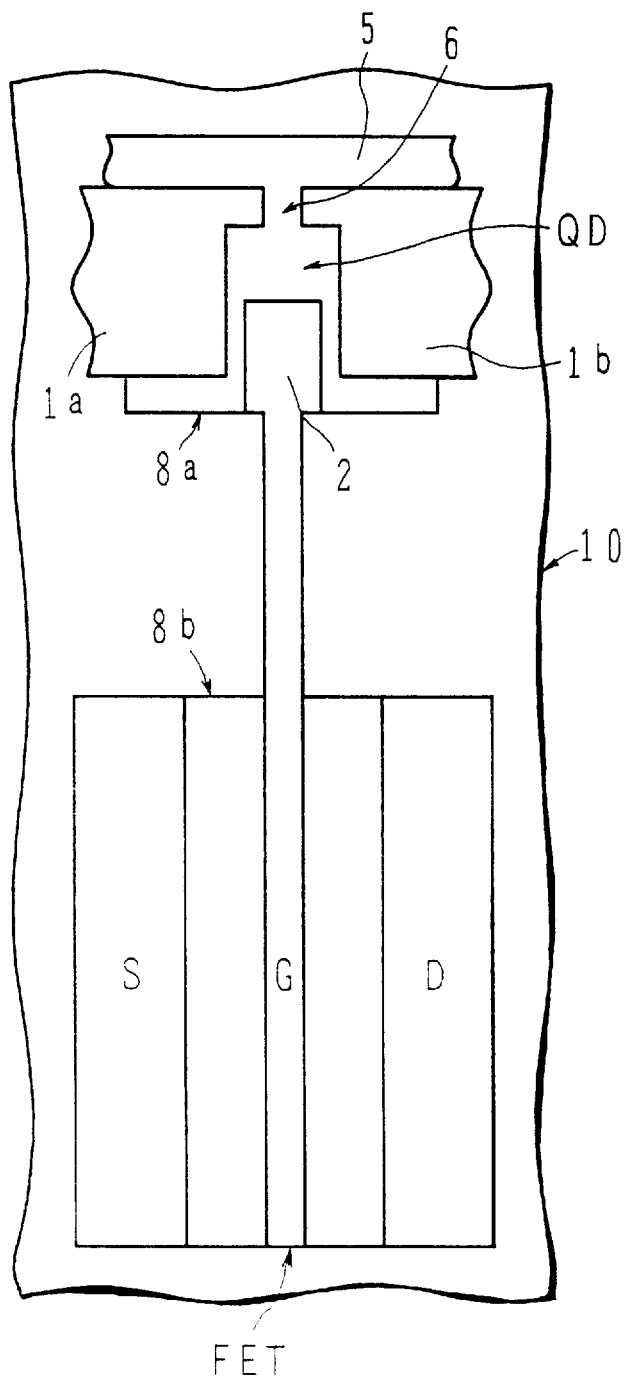
FIGS. 1A and 1B are a plan view and an equivalent circuit diagram showing a semiconductor quantum dot device according to an embodiment of the present invention.
Figure 1B:
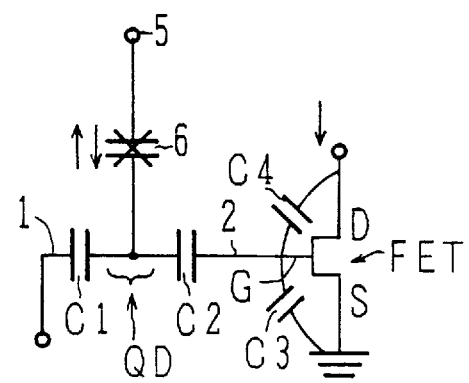

FIGS. 1A and 1B show a basic embodiment of the present invention. FIG. 1A is a plan view of a semiconductor quantum dot device according to a basic embodiment of the present invention, and FIG. 1B is an equivalent circuit diagram thereof.

FIG. 1A shows a quantum dot QD shown at an upper part of the figure, and a field effect transistor FET shown at a lower part of the figure. In a semiconductor substrate 10, a quantum well layer is formed in an area which covers at least electron transport regions 8a and 8b.

On the electron transport region 8a as shown at the upper part of the figure, electrodes 1a, 1b, and 2 are disposed so as to define a minute area, and define a quantum dot QD within the minute area.

That is, when depletion layers are developed within the electron transport region 8a by applying a reverse voltage, including built-in voltage, to the electrodes 1a, 1b, and 2, a quantum dot which limits a motion of an electron in three-dimensional directions is formed. At an upper part of the quantum dot, a pair of electrodes 1a and 1b are disposed facing to each other, and form a minute tunnel junction 6 therebetween.

Above the minute tunnel junction 6 an electron in/out region 5 is disposed, which in/out region gives electrons to or takes electrons from the quantum dot in accordance with its potential difference to that of the quantum dot QD.

The electrode 2 disposed at a lower part of the quantum dot not only defines the quantum dot QD together with the electrodes 1a and 1b, but also plays a role to take out a voltage of quantum dot QD by coupling capacitively with the quantum dot QD. The electrode 2 is connected with a gate electrode G of the field effect transistor FET disposed at the lower part of the figure.

The gate electrode G covers across the electron transport region or the electron channel region 8b and controls an electron current which passes through the electron channel region 8b. A source electrode S and a drain electrode D are connected to the electron transport region 8b sandwiching the gate electrode G.

Electrodes which define a quantum dot are preferably divided into three members as described above. Two of the electrodes are used to control the minute tunnel junction or a valley shaped potential barrier. These electrodes and the separate electrode are capacitively coupled with the quantum dot.

In FIG. 1B, an equivalent circuit of a semiconductor quantum dot as shown in FIG. 1A is shown. The quantum dot QD is capacitively coupled with the electrodes 1 and 2, (as shown in FIG. 1B), and is connected with the electron in/out region 5 through the minute tunnel Junction 6. The reference numeral 1 in FIG. 1B corresponds to 1a and 1b in FIG. 1A. By controlling a voltage between the electrodes 1 and the electron in/out region 5, the electron in/out region 5 and the quantum dot QD are subjected to transfer an electron or electrons therebetween.

The quantum dot QD is connected with the gate electrode G of the field effect transistor (FET) through a capacitor C2 formed with the electrode 2. The FET comprises the gate electrode G, a channel formed therebeneath, the source electrode S and the drain electrode D connected on both sides of the channel. When a voltage of the gate electrode G changes, a current between the source S and the drain D changes.

The quantum dot QD is subjected to coming-in and going-out of the electron with the electron in/out region 5 via the minute tunnel junction, and, at the same time, capacitively coupled with the electrodes 1 and 2 through capacitors C1 and C2. The electrode 2 is directly connected with the gate electrode G of the FET to transmit a potential change of the quantum dot when the potential is changed.

By setting the ratio $e^2/(C1+C2)$ much larger than the thermal energy, $e^2/(C1+C2)>>kT$, detection of change of potential of quantum dot QD corresponding to the coming-in and going-out of the electron becomes easy, since the potential change becomes sufficiently large compared with thermal noise or the like, and the change of the potential is enabled to be transferred to the FET with a predetermined ratio. Thus, it is important that the sum of capacitances (C1+C2) be made small. Regarding the ratio of C2 to C1, the ratio C2/C1 is preferably set large, e.g. larger than one. Here, the going in and out of a current through a minute tunnel junction as described above is known as a Coulomb blockade effect.

Figure 2A:
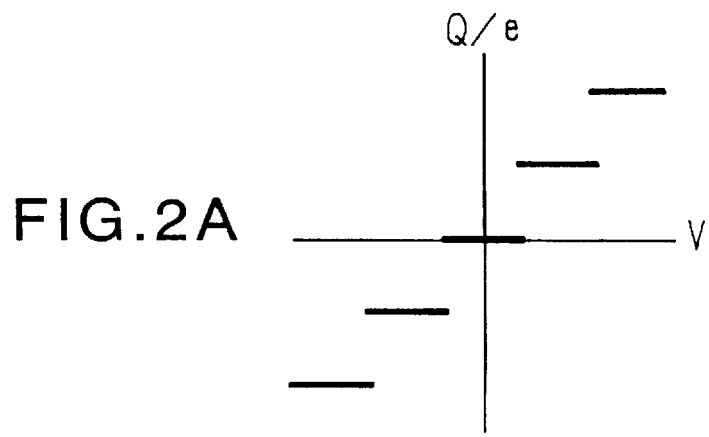
FIGS. 2A, 2B, and 2C are graphs illustrating characteristics of the semiconductor quantum dot device as shown in FIGS. 1A and 1B.
Figure 2B:
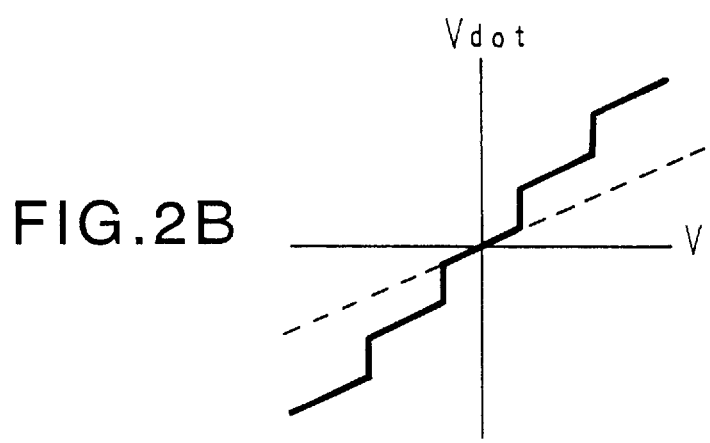
Figure 2C:
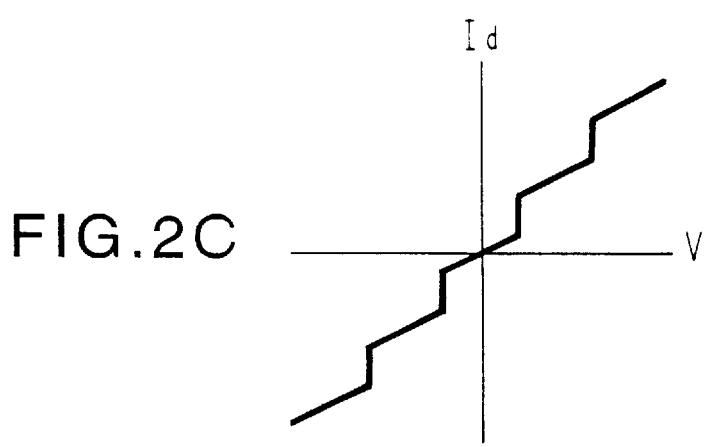

FIGS. 2A to 2C are graphs showing characteristics of a semiconductor device as shown in FIGS. 1A and 1B. FIG. 2A is a graph showing a change of accumulated charge Q in a unit of electronic charge e in the quantum dot QD as a result of a change of voltage V in the electron in/out region 5 with respect to the quantum dot QD.

When the electric potential V of the electron in/out region 5 increases up to a certain value, one electron is injected to the quantum dot QD, and a normalized charge Q/e of the quantum dot QD increases by one step. The step shaped change is caused since the change of electric charge occurs at every integer times the electronic charge e.

When two electrons are accumulated, the normalized charge shows a step shaped increase again. The normalized accumulated charge Q/e of the quantum dot QD shows a step shaped change in accordance with the potential change V of the electron in/out region 5, as has been described.

FIG. 2B shows a change of an electric potential $V_{dot}$ in the quantum dot QD, caused by the application of voltage to the electron in/out region 5 and the change in an accumulated charge in the quantum dot QD accompanying therewith.

Since the quantum dot QD is coupled capacitively with the electron in/out region 5, the potential of the quantum dot also changes almost linearly as the potential V of the electron in/out region 5 changes. A broken line shows this change in the potential of the quantum dot QD.

When an electron is thrown into the quantum dot QD, the potential is subjected to a step-like change. The step-like change is imposed over the above-mentioned linear change. At each change in the number of electrons accumulated in the quantum dot QD, the step-like change is repeated. Consequently, the potential $V_{dot}$ of the quantum dot QD changes with the change of the potential V of the electron in/out region 5 as shown in the figure.

FIG. 2C shows a change in the drain current $I_d$ of the field effect transistor FET which changes with the potential change of the quantum dot QD as shown in FIG. 2B. As the potential of the quantum dot $V_{dot}$ changes as shown in FIG. 2B, the potential change is transmitted to the electrode 2 and also further transmitted directly to the gate electrode G of the FET.

Thus, the drain current $I_d$ in FET, in accordance with this potential change, changes in a step-like manner and also linearly, as shown in FIG. 2C. By detecting such current change in the FET, the change in the number of electrons accumulated in the quantum dot QD can be detected.

Figure 3A:
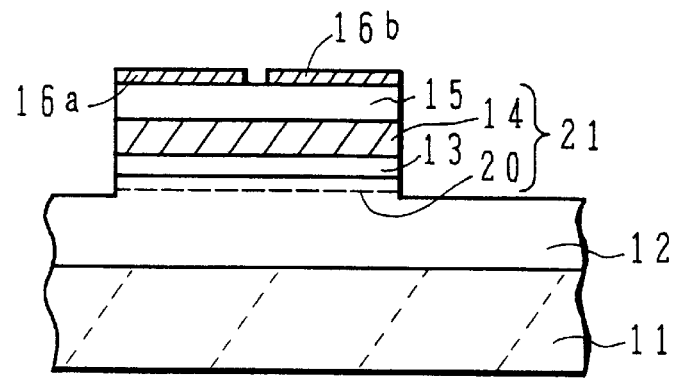
FIGS. 3A and 3B are a sectional view and a plan view showing a configuration of the semiconductor quantum dot device according to an embodiment of the present invention.
Figure 3B:
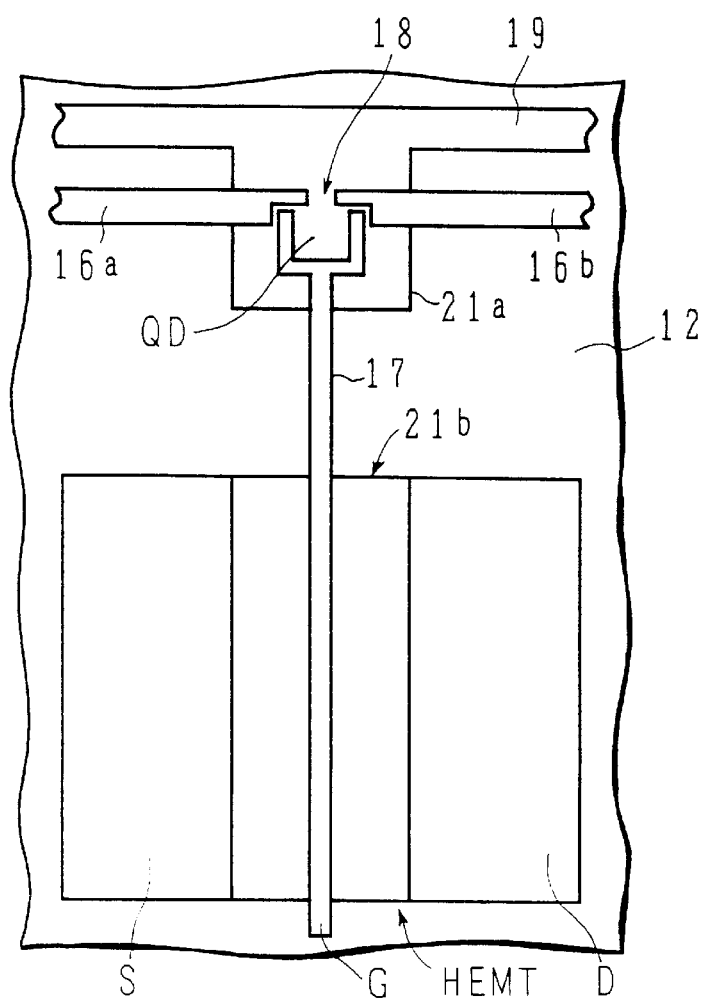

FIGS. 3A and 3B are a sectional view and a plan view showing a more concrete embodiment of the present invention. FIG. 3A shows an epitaxial structure of a semiconductor wafer for forming a quantum dot device according to the embodiment.

On a semi-insulating GaAs substrate 11, a channel layer or an electron travelling layer 12 of, for example, nondoped GaAs with a thickness of approximately 900 nm is formed. A spacer layer 13 formed of a non-doped $Al_x Ga_{1-x}$ As (where x=0.3) is grown epitaxially on the channel layer 12. The electron supply layer may be disposed adjacent to the electron travelling layer, the electron supply layer and the electron travelling layer having an interface therebetween.

The spacer layer 13, being formed of $Al_x Ga_{1-x}$ As (where x=0.3), has a wider band gap than the non-doped GaAs layer 12. Therefore a narrow potential well is formed in the GaAs electron travelling layer 12 in the vicinity of the interface with the spacer layer 13.

An electron supply layer 14 formed of n-type $Al_x Ga_{1-x} As$ (where x=0.3) doped with n-type impurities is grown epitaxially on the spacer layer 13 with a thickness of approximately 25 nm. Carrier density of the electron supply layer 14 is, for example, $1.5 \times 10^{18}$ cm$^{-3}$.

Since the electron supply layer 14, has a wider band gap than the electron travelling layer 12, electrons released from the electron supply layer 14 are supplied to the electron travelling layer 12 via the spacer layer 13, and trapped at a narrow potential well provided adjacent to the interface, forming a two-dimensional electron gas 20.

On the electron supply layer 14, a cover layer 15, for example, of non-doped GaAs is formed with a thickness of approximately 25 nm. On this cover layer 15, aluminium electrodes 16a, 16b are formed to establish Schottky contacts.

By patterning the above-described hetero-epitaxial laminate with mesa-etching to remove the laminate away, for example, to a pre-determined depth of the electron travelling layer 12, a mesa structure 21 including a region containing a two-dimensional electron gas 20 is formed.

Such a hetero-junction structure 21 resembles an epitaxial structure used for the high electron mobility transistor (HEMT). Disposition of the electron supply layer 14 on the electron travelling layer 12 enabled to form the two-dimensional electron gas 20 in the vicinity of the interface of the electron travelling layer 12. A region where the two-dimensional electron gas 20 is formed is controlled by the potential of the Schottky electrodes 16a and 16b.

When a reverse bias voltage is applied to the Schottky electrodes 16a and 16b, the region where the two-dimensional electron gas 20 exists is limited to a region above which there are no Schottky electrodes 16a and 16b.

An electrostatic capacitance between the Schottky electrodes and the two-dimensional electron gas is fairly small under such condition, because of a small area of overlap therebetween, and of the non-doped cover layer interposed therebetween.

FIG. 3B shows a plan view of a semiconductor quantum dot device according to the embodiment. A mesa structure 21 is formed selectively on the surface of a non-doped GaAs layer 12 which becomes an electron travelling layer. Within this mesa structure 21, a two-dimensional electron gas 20 is formed, as shown in FIG. 3A.

Mesa etching of a hetero-junction structure can be performed using a mask. In this case, due to the limit of optical exposure, it is difficult to form a region in which a two-dimensional electron gas can exist extremely small.

Consequently, as shown in a mesa structure 21a of FIG. 3B, the region where is a two-dimensional electron gas exists is formed, for example, with an area of approximately of the order of 2 µm square. This is too large an area for a quantum dot. An area of the quantum dot QD defined by electrodes 17, 16a and 16b formed in the mesa structure is formed more minutely using such techniques as electron beam (EB) lithography, to provide an area, for example, of the order of 0.5 µm square.

A gate electrode G of a HEMT is formed with a gate length of an order of 0.1 to 0.2 µm using such method as EB lithography.

By employing processes described above for optimizing dimensions of each member, a sufficiently large potential change of quantum dot QD when an electron comes in or goes out of the quantum dot QD can be obtained.

The mesa structure 21a shown in the upper part of the figure corresponds to a region of the quantum dot, and is formed with electrodes 16a, 16b, and 17, which define the quantum dot QD.

On the mesa structure 21b shown in the lower part of the figure, a Schottky gate electrode G, and an ohmic source electrode S and on ohmic drain electrode D are formed, and thereby, to form a high electron mobility transistor HEMT that transports carriers of charge from the source electrode S to the drain electrode D.

Here, the electrodes 16a, 16b, and 17 are Schottky electrodes formed, for example, of aluminium. When a reverse bias is applied, the two-dimensional electron gas beneath the electrodes is pushed away by a depletion layer to the quantum dot QD, and at the same time, a portion 18 between the opposing portions of the two electrodes 16a and 16b forms a minute tunnel junction. Here, the reverse bias may also be given by a built-in potential.

By adjusting a potential between an electron in/out region 19 disposed over the minute tunnel junction 18 and the quantum dot QD, electrons come in to and go out of the quantum dot QD via a minute tunnel junction 18.

Potential in the quantum dot QD changes with the change in number of electrons within the quantum dot QD described above. When, for example, the quantum dot QD has a dimension of approximately 0.5 µm square, the potential of the quantum dot QD changes with an order of mV upon coming-in or going-out of a single electron.

The Schottky electrode 17 coupled capacitively with the quantum dot QD has a role to detect a change of potential in the quantum dot QD when it occurs. The potential change to be detected by the electrode 17 changes with the magnitude of the coupling capacitance.

Here, the coupling capacitance between the quantum dot QD and the electrode 17 is selected to be sufficiently small to prevent the potential of quantum dot QD to be pinned by a parasitic capacitance of the gate electrode G of the HEMT.

With a setting as described above, the potential of the quantum dot QD can change with a value of the order, for example, of mV, despite the existence of the gate electrode G. AT a sufficiently low temperature, a signal with a very small thermal noise is obtained. Because of the smallness of capacitive coupling, the potential change of the quantum dot QD is reduced and transferred to the gate electrode G of the HEMT.

The HEMT, however, transforms the minute potential change to a change of a drain current and an output current is detected.

The change in a drain current $\Delta I_d$ is defined by:

$$\Delta I_d \approx g_m e / C_{in},$$

where $g_m$ denotes a transconductance of the HEMT, $C_{in}$ denotes an input capacitance, and $e$ denotes an electronic charge.

The gate electrode of the HEMT can be formed with a gate length of 0.1 to 0.2 µm. In this case, the input capacitance of the gate electrode is about 1 pF/mm, and the transconductance $g_m$ is 250 mS/mm, which gives $\Delta I_d \approx 40$ nA. The change in the drain current $\Delta I_d$ is reduced when there is a floating capacitance at the gate electrode. Even when $\Delta I_d$ is reduced to 1/10, $\Delta I_d \approx 4$ nA, which is a current sufficiently detectable.

And, when a ratio of the coupling capacitance of the quantum dot QD with respect to the electrode 17 is about 0.2 of the total coupling capacitance of the quantum dot QD, the change which appears in the drain current of the HEMT gives 0.2×40=8 nA, which also is a current sufficiently detectable.

Figure 4A:
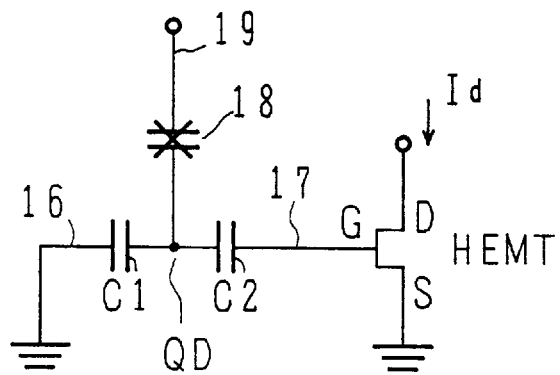
FIGS. 4A to 4C are equivalent circuit diagrams showing examples of the detection circuit of a semiconductor quantum dot according to embodiments of the present invention.
Figure 4B:
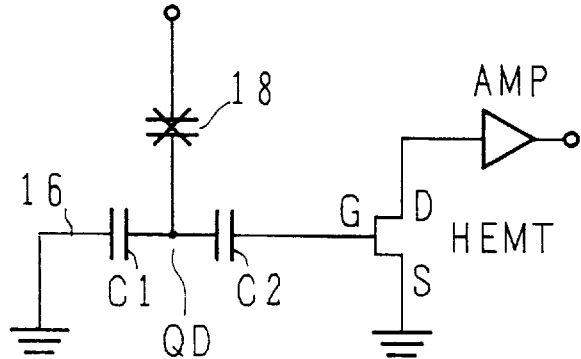
Figure 4C:
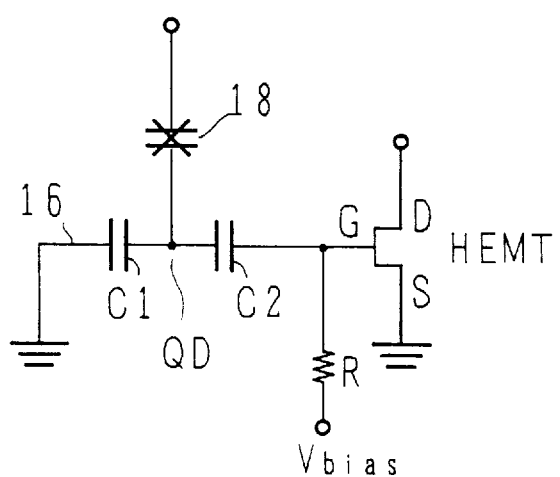

FIGS. 4A, 4B, and 4C show examples of circuit configuration using a semiconductor quantum dot device as shown in FIGS. 3A and 3B. FIG. 4A is an equivalent circuit diagram using a semiconductor quantum dot device shown in FIGS. 3A and 3B. A quantum dot QD couples with an electrode 16 via a capacitor C1, with an electrode 17 via a capacitor C2, and yet with an electron in/out region 19 via a minute tunnel junction 18.

The electrode 17 is connected directly with a gate electrode of a HEMT. The HEMT comprises a source electrode S and a drain electrode D formed on both sides of a channel region disposed underneath the gate electrode G, and provides a drain current $I_d$ between the source and drain electrodes.

A number of electrons accumulated in the quantum dot QD can be detected by the semiconductor quantum dot device as shown in FIG. 4A. For obtaining a clearer signal, however, it is preferable to amplify output signal.

FIG. 4B shows a configuration of a semiconductor quantum dot device provided with an output amplifier. The figure shows, in addition to the circuit shown in FIG. 4A, an output amplifier AMP connected to the drain electrode of the HEMT. The output amplifier AMP produces an output by amplifying the change of the drain current.

FIG. 4C shows an example of configuration for stabilizing the operation of the high electron mobility transistor HEMT shown in FIG. 4A. In this figure, a bias voltage source $V_{bias}$ is connected to the gate electrode of the HEMT in the semiconductor quantum dot circuit shown in FIG. 4A through a resistance R.

By applying a direct current bias voltage from the bias voltage source $V_{bias}$ via the resistance R to the gate electrode G of the HEMT, an operating point of the HEMT is set. Thus an optimum operating condition for operating the HEMT can be obtained. In this occasion, a value for an operating frequency is preferably set to be faster than a CR time constant of the gate electrode G.

The present invention has been described above in relation to preferred embodiments. The present invention is not limited to what has been described in the above embodiments. For example, laminated structure of the HEMT which used a two-dimensional electron gas is not limited to what has been shown in the figures.

An electron travelling layer may not be limited to be of GaAs, and may also be formed of other semiconductor materials as InGaAs, or the like. There are choice of various materials for an electron supply layer that matches a material selected for the electron travelling layer. Further, materials for each member can be changed in many ways.

A transistor to detect a potential change of a semiconductor quantum dot is not limited to what has been described above.

It will be apparent to those skilled in arts that various changes, substitutions, combinations and improvements can be made within the scope and spirit of the appended claims.

I claim:

1. A semiconductor quantum dot device comprising:
   a semiconductor quantum dot formed on a semiconductor wafer;
   a field effect type transistor formed on said semiconductor wafer outside of said semiconductor quantum dot and comprising a gate electrode formed in a vicinity of said semiconductor quantum dot; and
   coupling means for coupling said gate electrode and said semiconductor quantum dot capacitively and not directly coupled with an external voltage source.

2. A semiconductor quantum dot device according to claim 1, wherein a capacitance associated with said semiconductor quantum dot is so small as to produce a potential change larger than a thermal noise upon coming-in or going-out of an electron.

3. A semiconductor quantum dot device according to claim 2, further comprising electrode means for producing depletion region around said semiconductor quantum dot.

4. A semiconductor quantum dot device according to claim 3, wherein said electrode means forms a capacitance with said quantum dot, which is smaller than a capacitance formed between said quantum dot and said gate electrode.

5. A semiconductor quantum dot device according to claim 1, wherein said semiconductor wafer comprises a semi-insulating substrate, an electron travelling layer, an electron supply layer, and a non-doped layer as stacked laminate.

6. A semiconductor quantum dot device according to claim 5, wherein said field effect type transistor is a high electron mobility transistor.

7. A semiconductor quantum dot device according to claim 1, further comprising an amplifier connected to said field effect type transistor.

8. A semiconductor quantum dot device according to claim 1, further comprising a resistor connected to the gate electrode of the field effect transistor.

9. A semiconductor quantum dot device comprising:
   a semi-insulating substrate,
   a hetero-junction structure formed on said semi-insulating substrate, comprising a non-doped electron travelling layer with a low impurity concentration and a comparatively narrow band gap and an electron supply layer with a high impurity concentration and a comparatively wide band gap, and forming a two-dimensional electron gas in the electron travelling layer in a region adjacent to an interface of the electron travelling layer on the side of the electron supply layer, and
   Schottky electrodes formed on said hetero-junction structure;
   wherein said hetero-junction structure includes two regions which can at least form a two-dimensional electron gas, said Schottky electrodes form a quantum dot on one of said two regions and a gate electrode of a high electron mobility transistor on the other of said two regions, and at least a part of the Schottky electrodes forming the quantum dot is connected to said gate electrode.

10. A semiconductor quantum dot device according to claim 9, further comprising a pair of ohmic electrodes formed on the other of said regions sandwiching said gate electrode therebetween.

* * * * *